United States Patent
Tang et al.

(10) Patent No.: US 11,393,544 B2
(45) Date of Patent: Jul. 19, 2022

(54) MEMORY DEVICE CAPABLE OF REDUCING PROGRAM DISTURBANCE AND ERASING METHOD THEREOF

(71) Applicant: YANGTZE MEMORY TECHNOLOGIES CO., LTD., Wuhan (CN)

(72) Inventors: Qiang Tang, Wuhan (CN); Xiang Fu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/187,683

(22) Filed: Feb. 26, 2021

(65) Prior Publication Data

US 2021/0183459 A1 Jun. 17, 2021

Related U.S. Application Data

(63) Continuation of application No. 16/726,802, filed on Dec. 24, 2019, now Pat. No. 10,998,063, which is a
(Continued)

(51) Int. Cl.
*G11C 16/34* (2006.01)
*G11C 16/08* (2006.01)
(Continued)

(52) U.S. Cl.
CPC .......... *G11C 16/3436* (2013.01); *G11C 16/08* (2013.01); *G11C 16/107* (2013.01);
(Continued)

(58) Field of Classification Search
CPC . G11C 16/0483; G11C 16/10; G11C 11/5642; G11C 16/3459; G11C 16/16; G11C 16/08; G11C 11/5628; G11C 16/26; G11C 16/3445; G11C 11/5635; G11C 2211/5621; G11C 16/28; G11C 16/14; G11C 16/24; G11C 2216/18; G11C 16/06;
(Continued)

(56) References Cited

U.S. PATENT DOCUMENTS 10,998,063 B1 * 5/2021 Tang .................... G11C 11/5628
2014/0369129 A1 12/2014 Dutta
(Continued)

FOREIGN PATENT DOCUMENTS

CN 1538459 B 5/2010
CN 109119120 A 1/2019
(Continued)

*Primary Examiner* — Thong Q Le
(74) *Attorney, Agent, or Firm* — Bayes PLLC

(57) ABSTRACT

An erasing method is used in a memory device. The memory device includes a string of memory cells and a controller, the string of memory cells including a plurality of special memory cells not for storing data and a plurality of main memory cells for storing data. The erasing method includes: the controller verifying if at least one special memory cell of the plurality of special memory cells has failed; the controller resetting the at least one special memory cell if the at least one special memory cell has failed; and the controller erasing the plurality of main memory cells.

20 Claims, 6 Drawing Sheets

Related U.S. Application Data continuation of application No. PCT/CN2019/118332, filed on Nov. 14, 2019.

(51) Int. Cl.
  *G11C 16/10* (2006.01)
  *G11C 16/14* (2006.01)
  *G11C 16/28* (2006.01)
  *G11C 29/44* (2006.01)

(52) U.S. Cl.
  CPC ............ *G11C 16/14* (2013.01); *G11C 16/28* (2013.01); *G11C 29/44* (2013.01)

(58) Field of Classification Search
  CPC ..... G11C 16/344; G11C 16/3472; G11C 5/02; G11C 29/52; G11C 16/3454; G11C 16/34; H01L 27/11551; H01L 27/11578; H01L 27/11582; H01L 29/792; H01L 29/7926; H01L 27/1157
  USPC ............ 365/185.17, 185.03, 185.18, 185.11, 365/185.22, 185.19, 185.21, 185.24, 365/185.29, 185.12, 185.25, 189.05, 365/185.05, 185.13, 185.2, 189.04, 365/185.23, 189.09, 185.3, 185.33; 711/103, 165
  See application file for complete search history.

(56) References Cited

U.S. PATENT DOCUMENTS

| | | |
|---|---|---|
| 2016/0260489 A1 | 9/2016 | Lee |
| 2017/0256320 A1 | 9/2017 | Lang et al. |
| 2018/0068726 A1 | 3/2018 | Song |
| 2018/0308550 A1 | 10/2018 | Shiino et al. |
| 2020/0020404 A1* | 1/2020 | Kim .................... G11C 7/14 |

FOREIGN PATENT DOCUMENTS

| | | |
|---|---|---|
| CN | 109949835 A | 6/2019 |
| TW | 200509136 | 3/2005 |
| TW | 200603169 | 1/2006 |
| TW | 200715293 | 4/2007 |
| TW | 200717526 | 5/2007 |
| TW | 201027538 A1 | 7/2010 |

\* cited by examiner

MEMORY DEVICE CAPABLE OF REDUCING PROGRAM DISTURBANCE AND ERASING METHOD THEREOF

CROSS REFERENCE TO RELATED APPLICATIONS

This application is a continuation of U.S. application Ser. No. 16/726,802, filed Dec. 24, 2019, which is a continuation of International Application No. PCT/CN2019/118332, filed Nov. 14, 2019, both of which are incorporated herein by reference in their entireties.

BACKGROUND

The disclosure relates to memory device, and in particular, to a memory device capable of reducing program disturbance and an erasing method thereof.

As technology advances, high-density memory cells have been incorporated in semiconductor memory devices to reduce overall device sizes and increase data storage capabilities. Nevertheless, the increase in integration density may lead to an increase in coupling between memory cells and an unselected memory cell may be inadvertently programmed. The unintentional programming of the unselected memory cell is referred to as "program disturbance."

SUMMARY

In one embodiment, a memory device includes a string of memory cells, a plurality of special word lines, a plurality of main word lines and a controller. The string of memory cells includes a plurality of special memory cells and a plurality of main memory cells. The plurality of special memory cells are coupled in series, arranged at one end of the string of memory cells, and not for storing data. The plurality of main memory cells are for storing data and coupled in series. One of the plurality of main memory cells is coupled to one of the plurality of special memory cells. The plurality of special word lines are coupled to the plurality of special memory cells, respectively. The plurality of main word lines are coupled to the plurality of main memory cells, respectively. The controller is coupled to the plurality of special word lines and the plurality of word lines, and used to verify if at least one special memory cell of the plurality of special memory cells has failed, reset the at least one special memory cell if the at least one special memory cell has failed, and erase the plurality of main memory cells.

In another embodiment, an erasing method is adopted in a memory device. The memory device includes a string of memory cells and a controller. The string of memory cells includes a plurality of special memory cells not for storing data and a plurality of main memory cells for storing data. The erasing method includes: the controller verifying if at least one special memory cell of the plurality of special memory cells has failed; the controller resetting the at least one special memory cell if the at least one special memory cell has failed; and the controller erasing the plurality of main memory cells.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
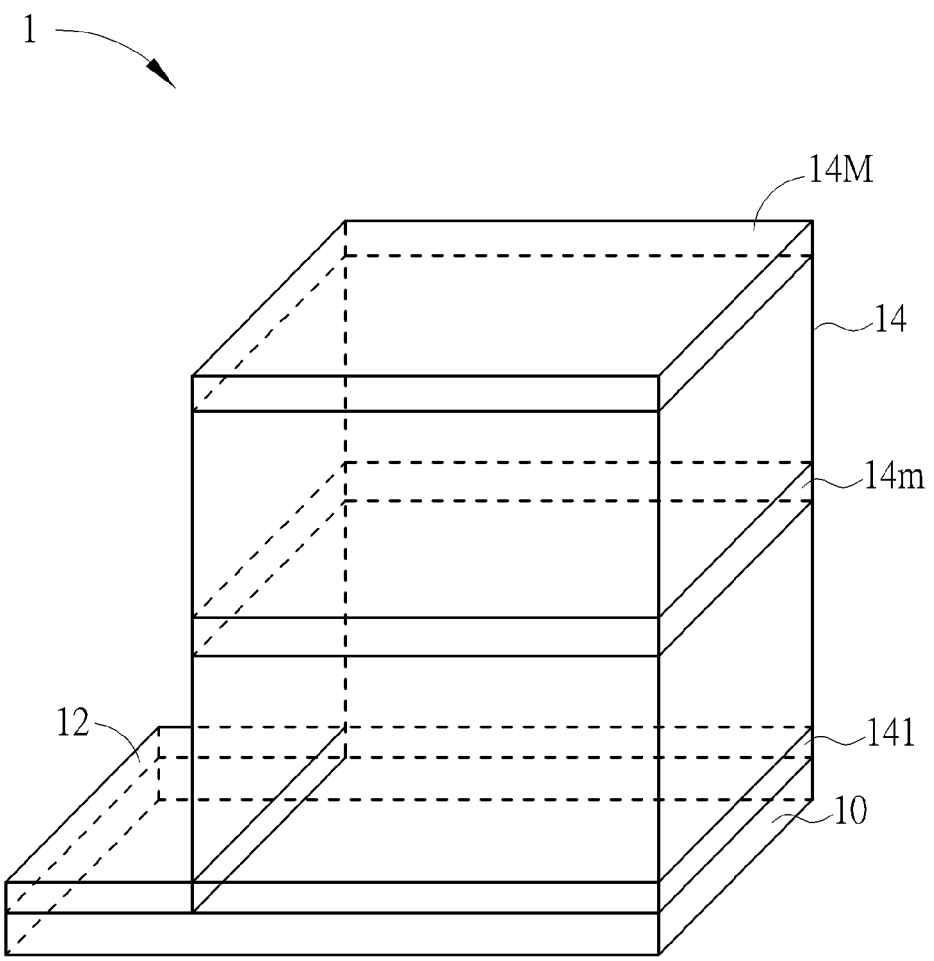
FIG. 1 is a perspective view of a memory device according to an embodiment of the disclosure.

FIG. 1 is a perspective view of a memory device 1 according to an embodiment of the disclosure. The memory device 1 may be a 3-dimentional (3D) NAND flash device, and may include a substrate 10, a controller 12 and a memory circuit 14. The controller 12 and the memory circuit 14 may be disposed on the substrate 10. The memory circuit 14 may contain a plurality of cell arrays 141 to 14M stacked in layers and used for data storage, M being a positive integer. The controller 12 may be coupled to the memory circuit 14 to control reading, programming and/or erasing operations of the memory circuit 14, and may communicate with an external host to receive data for storage in the memory circuit 14 and to transmit data fetched from the memory circuit 14.

Figure 2:
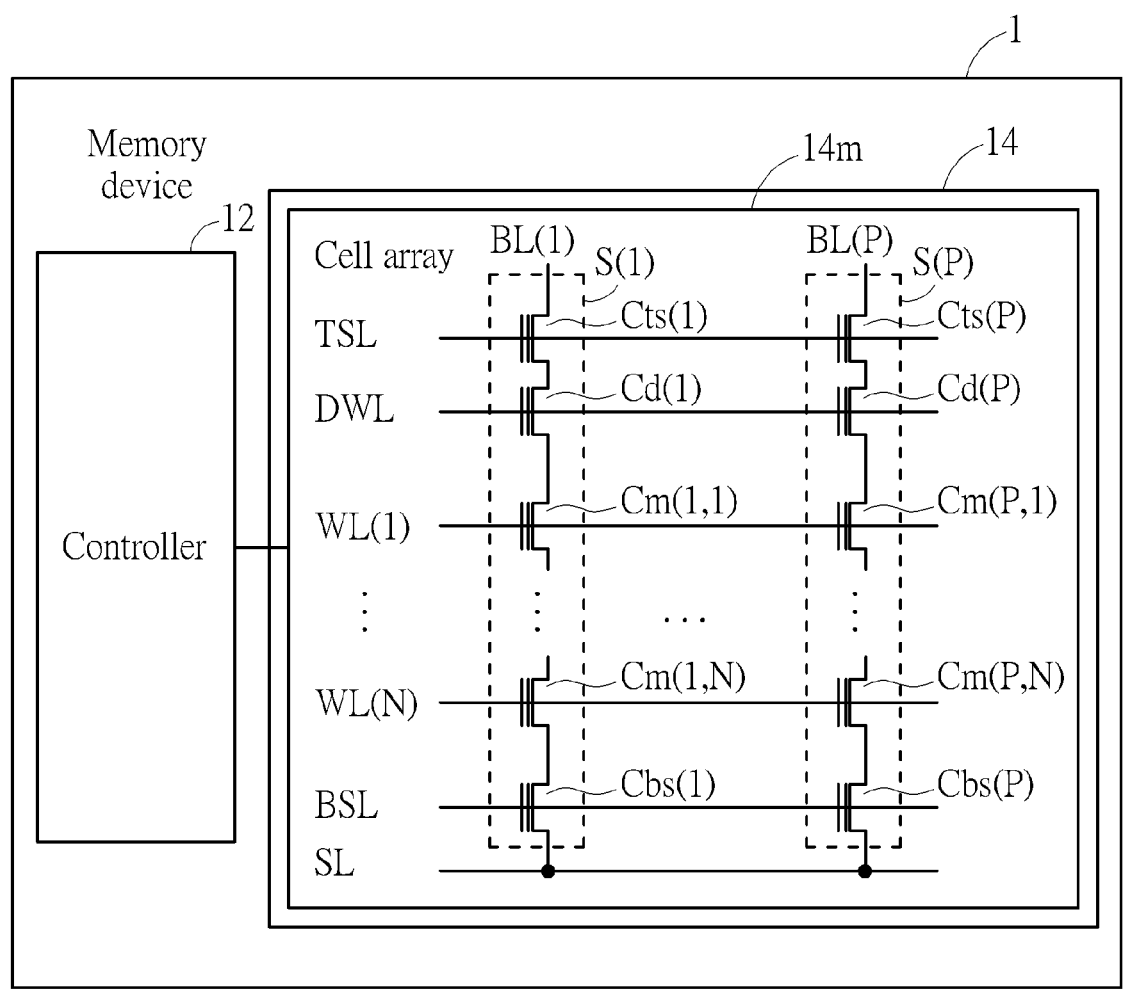
FIG. 2 is a block diagram of the memory device in FIG. 1.

FIG. 2 is a block diagram of the memory device 1. The memory device 1 may include a top selection line TSL, a dummy word line DWL, word lines WL(1) to WL(N), a bottom selection line BSL, a source line SL, bit lines BL(1) to BL(P), the controller 12, and the memory circuit 14 including a plurality of cell arrays 141 to 14M where only the cell array 14$m$ is shown on FIG. 2, wherein N, P are positive integers, e.g., N=64 and P=8192, m being a positive integer and m≤M. The top selection line TSL and the dummy word line DWL may be referred to as special word lines.

The cell array 14$m$ may include top selection cells Cts(1) to Cts(P), dummy memory cells Cd(1) to Cd(P), main memory cells Cm(1,1) to Cm(P,N), bottom selection cells Cbs(1) to Cbs(P) arranged into cell strings S(1) to S(P). In some embodiments, the cell array 14$m$ may include two or more rows of the top selection cells, dummy memory cells and bottom selection cells. Moreover, in some embodiments, the cell array 14$m$ may include one or more rows of dummy memory cells between the row of bottom selection cells and the main memory cells Cm(1,1) to Cm(P,N). The memory device 1 may be used to verify and reset the top selection cells Cts(1) to Cts(P) and the dummy memory cells Cd(1) to Cd(P) of the cell arrays 141 to 14M during an erasing operation, thereby reducing program disturbance.

Each of the top selection cells Cts(1) to Cts(P), the dummy memory cells Cd(1) to Cd(P), the main memory cells Cm(1,1) to Cm(P,N) and the bottom selection cells Cbs(1) to Cbs(P) may be a floating-gate transistor or a charge-trapping transistor including a control terminal, a first terminal and a second terminal. The top selection line TSL may be coupled to the control terminals of the top selection cells Cts(1) to Cts(P), and the bit lines BL(1) to BL(P) may be respectively coupled to the first terminals of the top selection cells Cts(1) to Cts(P). The dummy word line DWL may be coupled to the control terminals of the dummy memory cells Cd(1) to Cd(P), and the first terminals of the dummy memory cells Cd(1) to Cd(P) may be respectively coupled to the second terminals of the top selection cells Cts(1) to Cts(P). The word lines WL(1) to WL(N) may be coupled to the main memory cells Cm(1,1) to Cm(P,1) in a first row to the main memory cells Cm(1,N) to Cm(P,N) in an Nth row, respectively, and the first terminals of the main memory cells Cm(1,1) to Cm(P,1) may be coupled to the second terminals of the dummy memory cells Cd(1) to Cd(P), respectively. The bottom selection line BSL may be coupled to the control terminals of the bottom selection cells Cbs(1) to Cbs(P), the first terminals of the bottom selection cells Cbs(1) to Cbs(P) may be respectively coupled to the second terminals of the main memory cells Cm(1,N) to Cm(P,N), and the source line SL may be coupled to the second terminals of the bottom selection cells Cbs(1) to Cbs(P). The controller 12 may address the main memory cells Cm(1,1) to Cm(P,N) using the word lines WL(1) to WL(N) and the bit lines BL(1) to BL(P).

The top selection cells Cts(1) to Cts(P) and the dummy memory cells Cd(1) to Cd(P) may be referred to as special memory cells. Each string S(p) may contain special memory cells Cts(p), Cd(p), main memory cells Cm(p,1) to Cm(p,N), and a bottom selection cell Cbs(p), p being a positive integer and p≤P. The special memory cells Cts(p), Cd(p) are not used to store user data, are arranged at one end of the string S(p), and are coupled in series. The main memory cells Cm(p,1) to Cm(p,N) are used to store user data and coupled in series. The top selection cells Cts(1) to Cts(P), the dummy memory cells Cd(1) to Cd(P), the main memory cells Cm(1,1) to Cm(P,N) and the bottom selection cells Cbs(1) to Cbs(P) may be of a single-level cell (SLC) type, a multi-level cell (MLC) type, a triple-level cell (TLC) type, a quad-level cell (QLC) type, or a higher-level type, and programmed into one of Q possible states, Q being a positive integer greater than 1, e.g., Q=2 for an SLC, Q=4 for an MLC, Q=8 for a TLC, and Q=16 for a QLC.

In a programming operation, the supply voltage (e.g., 3.3V) may be applied to the top selection line TSL, the ground voltage (e.g., 0V) may be applied to the bottom selection line BSL, a program voltage (e.g., 20V) may be applied to a selected word line, a pass voltage (e.g., 10V) may be applied to unselected word lines and the dummy word line DWL, the ground voltage may be applied to a selected bit line, and the supply voltage may be applied to an unselected bit line. For example, when programming the main memory cell Cm(1,1), the top selection line TSL is driven by 3.3V, the bottom selection line BSL is grounded at 0V, the word line WL(1) is driven by 20V, the word lines WL(2) to WL(M) and the dummy word line DWL are driven by 10V, the bit line BL(1) is grounded at 0V and the bit lines BL(2) to BL(P) are driven by 3.3V. In such an arrangement, a large voltage difference is present between a channel region and the control terminal of a selected main memory cell, causing electrons to be injected from the channel region into a floating gate or charge-trapping layer of the selected main memory cell to program the same, while boosted voltages (e.g., 8V) are established at channel regions of unselected main memory cells by capacitive coupling the pass voltage from the control terminals to the channel regions thereof, preventing the unselected main memory cells from being programmed and reducing program disturbance. The top selection cells Cts(1) to Cts(P) may be programmed into a predetermined state (e.g., an erased state) prior to the programming operation. The dummy memory cells Cd(1) to Cd(P) may be programmed into a predetermined state (e.g., the erased state) prior to the programming operation, and biased at the control terminals thereof by the pass voltage or a dummy bias voltage during the programming operation, providing a gradual transition in channel voltages from the channel voltages of channel regions of the main memory cells Cm(1,1) to Cm(P,1) to the channel voltages of channel regions of the top selection cells Cts(1) to Cts(P), reducing program disturbance by suppressing gate induced drain leakage (GIDL) during the programming operation, particularly during programming one of the main memory cells Cm(1,1) to Cm(P,1). In some embodiments, the dummy bias voltage may be selected from a range between the pass voltage and the supply voltage.

In an erasing operation, in addition to erasing user data from the main memory cells Cm(1,N) to Cm(P,N), the threshold voltages of the top selection cells Cts(1) to Cts(P) and the dummy memory cells Cd(1) to Cd(P) may be verified and reset if the verification fails, thereby enabling the top selection cells Cts(1) to Cts(P) and the dummy memory cells Cd(1) to Cd(P) to operate properly and reduce the program disturbance in the programming operation. In some embodiments, the reset of the top selection cells Cts(1) to Cts(P) and the dummy memory cells Cd(1) to Cd(P) may be optional, and the setting of reset preference may be stored in a register in the memory device 1. When the reset preference is set to be enabled, the controller 12 may reset the top selection cells Cts(1) to Cts(P) and the dummy memory cells Cd(1) to Cd(P) upon detecting that the top selection cells Cts(1) to Cts(P) and the dummy memory cells Cd(1) to Cd(P) fail the verification; whereas when the reset preference is not set to be enabled, the controller 12 may abort the erasing operation upon detecting that the top selection cells Cts(1) to Cts(P) and the dummy memory cells Cd(1) to Cd(P) fail the verification. FIGS. 3 to 6 outline erasing methods and resetting methods of resetting the top selection cells Cts(1) to Cts(P) and the dummy memory cells Cd(1) to Cd(P) in the erasing operation.

Figure 3:
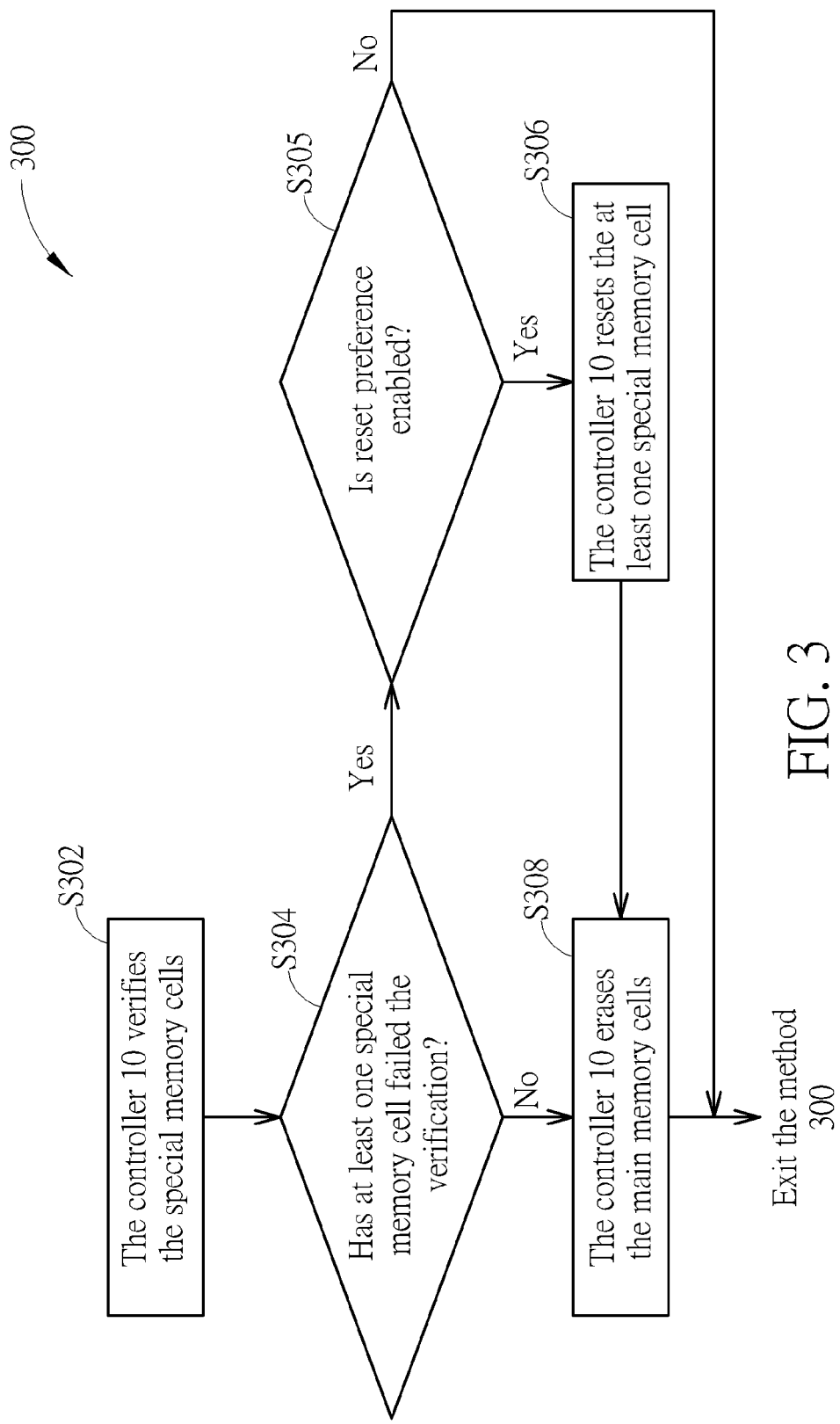
FIG. 3 is a flowchart of an erasing method for use in the memory device in FIG. 1.

FIG. 3 is a flowchart of an erasing method 300 for use in the memory device 1. The erasing method 300 comprises Steps S302 to S308, resetting the special memory cells prior to erasing data from the main memory cells Cm(1,N) to Cm(P,N). Steps S302 to S306 are used to set the special memory cells to proper threshold voltage ranges, and Step S308 is used to erase the main memory cells Cm(1,N) to Cm(P,N). In some embodiments, the erasing method may be adopted by the memory device 1 to verify and reset the top selection cells Cts(1) to Cts(P). Any reasonable step change or adjustment is within the scope of the disclosure. Steps S302 to S308 are explained as follows:

Step S302: The controller 10 verifies the special memory cells;

Step S304: Has at least one special memory cell failed the verification? If so, go to Step S305; and if not, go to Step S308;

Step S305: Is reset preference enabled? If so, go to Step S306; and if not, exit the method 300;

Step S306: The controller 10 resets the at least one special memory cell; go to Step S308;

Step S308: The controller 10 erases the main memory cells; exit the method 300.

Upon initialization of the erasing method 300, the controller 10 verifies the special memory cells using an upper verification level and a lower verification level (S302). The upper verification level and the lower verification level may be selected according to the lower bound and the upper bound of a predetermined threshold voltage distribution range of the special memory cells, respectively. When the threshold voltage of at least one special memory cell is outside the predetermined threshold voltage distribution range, the at least one special memory cell may not function properly and may lead to program disturbance, and the at least one special memory cell has failed the verification. The controller 10 next determines whether at least one special memory cell has failed the verification (S304), if not, the controller 10 erases the main memory cells Cm(1,1) to Cm(P,N) (S308) and exits the method 300, and if so, the controller 10 determines whether the reset preference is set to be enabled (S305). If the at least one special memory cell has failed the verification and the reset preference is not set to be enabled, the method 300 is exited without erasing the memory cells Cm(1,1) to Cm(P,N). If at least one special memory cell has failed the verification and the reset preference is set to be enabled, the controller 10 resets the at least one special memory cell by bringing the threshold voltage of the at least one special memory cell back within the predetermined threshold voltage distribution range (S306), and then erases the main memory cells Cm(1,1) to Cm(P,N) (S308).

Figure 4:
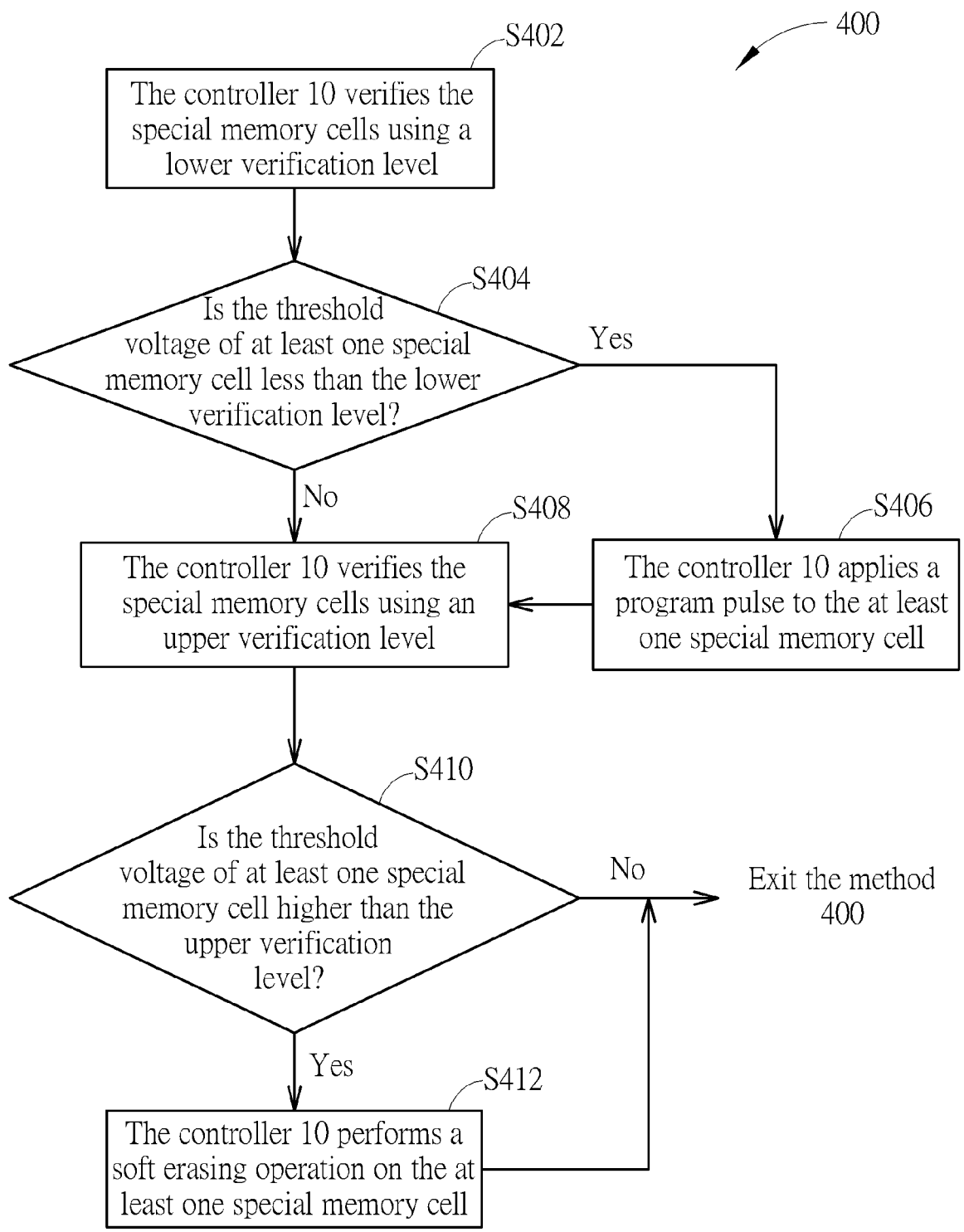
FIG. 4 is a flowchart of a resetting method incorporated in the erasing method in FIG. 3.

FIG. 4 is a flowchart of a resetting method 400 to be incorporated in the method 300. The resetting method 400 comprises Steps S402 to S412 for verifying and resetting the special memory cells. Any reasonable step change or adjustment is within the scope of the disclosure. Steps S402 to S412 are explained as follows:

Step S402: The controller 10 verifies the special memory cells using a lower verification level;

Step S404: Is the threshold voltage of at least one special memory cell less than the lower verification level? If so, go to Step S406; and if not, go to Step S408;

Step S406: The controller 10 applies a program pulse to the at least one special memory cell; go to Step S408;

Step S408: The controller 10 verifies the special memory cells using an upper verification level;

Step S410: Is the threshold voltage of at least one special memory cell higher than the upper verification level? If so, go to Step S412; and if not, exit the method 400;

Step S412: The controller 10 performs a soft erasing operation on the at least one special memory cell; exit the method 400.

In Step S402, the controller 10 applies the lower verification level to the control terminals of the special memory cells while reading the states thereof, and in Step S404, the controller 10 determines whether the threshold voltage of at least one special memory cell is less than the lower verification level according to the reading result. If a state of at least one special memory cell is read correctly using the lower verification level, the threshold voltage of the at least one special memory cell is less than the lower verification level and being too low, and therefore, in Step S406, the controller 10 applies one or more program pulses to the at least one special memory cell until the controller 10 is unable to read the state of the at least one special memory cell. Next in Step S408, the controller 10 applies the upper verification level to the control terminals of the special memory cells while reading the states thereof, and in Step S410, the controller 10 determines whether the threshold voltage of at least one special memory cell is higher than the lower verification level according to the reading result. If a state of at least one special memory cell is read incorrectly using the upper verification level, the threshold voltage of the at least one special memory cell is not higher than the upper verification level, and the method 400 is exited. If a state of at least one special memory cell is read incorrectly using the upper verification level, the threshold voltage of the at least one special memory cell is higher than the upper verification level and being too high, and therefore, in Step S412, the controller 10 performs a soft erasing operation on the at least one special memory cell to bring the threshold voltage thereof to below the upper verification level, and exits the method 400. The soft erasing operation may be performed by grounding the control terminal of the at least one special memory cell while applying an appropriate soft erasing voltage to the bit line of the at least one special memory cell, thereby discharging excessive charges from the floating gate or charge-trapping layer of the at least one special memory cell. The soft erasing voltage may be a positive voltage and smaller in magnitude than an erasing voltage adopted in an erasing operation. In some embodiments, the order of verifying and correcting the special memory cells too low in threshold voltages and the special memory cells too high in threshold voltages may be exchanged, that is, Steps S408 to S412 and Steps S402 to S406 may be swapped in places.

Figure 5:
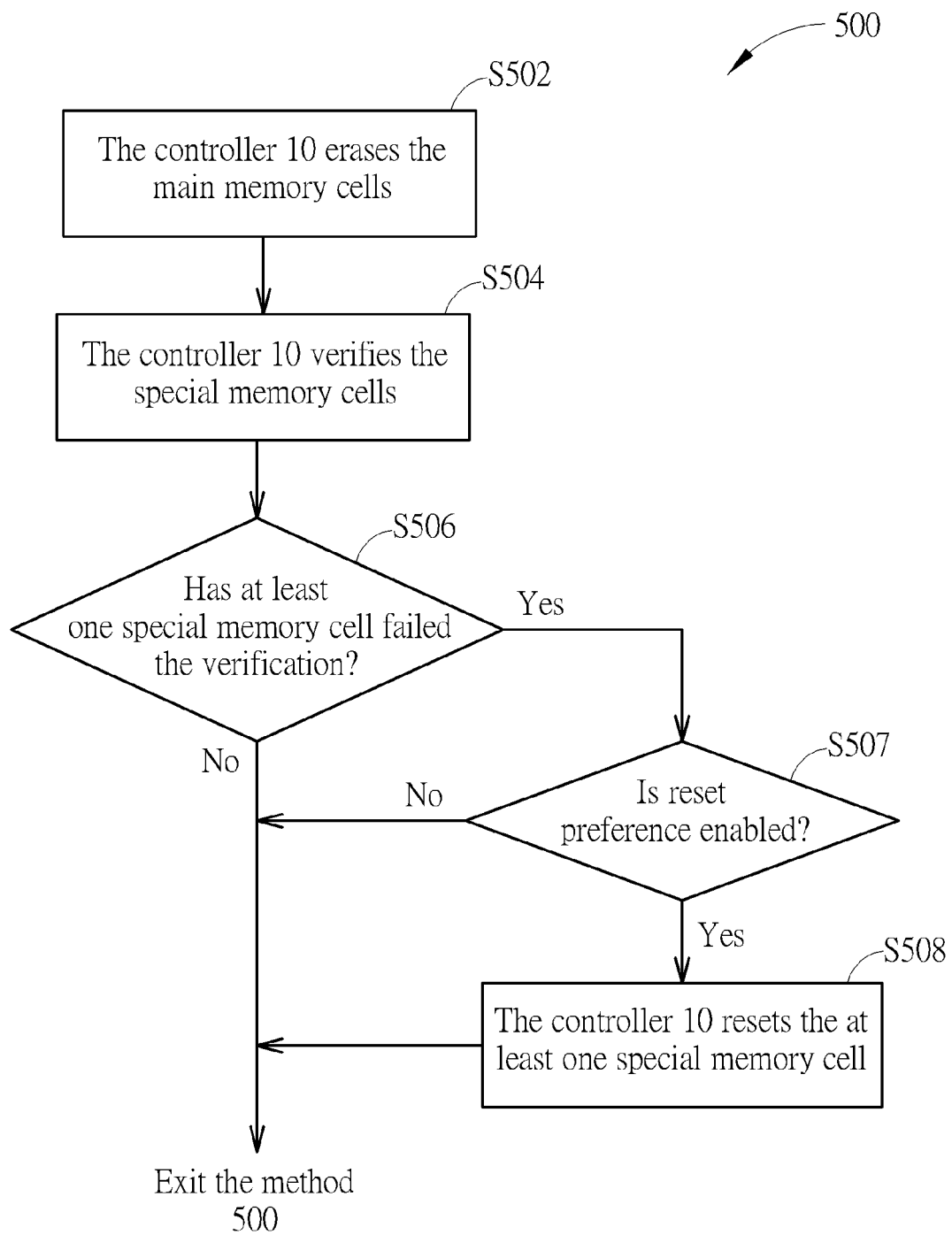
FIG. 5 is a flowchart of another erasing method for use in the memory device in FIG. 1.

FIG. 5 is a flowchart of another erasing method 500 for use in the memory device 1. The erasing method 500 comprises Steps S502 to S508, erasing data from the main memory cells Cm(1,N) to Cm(P,N) prior to resetting the special memory cells. Step S502 is used to erase the main memory cells, and Steps S505 to S508 are used to set the special memory cells to proper states. In some embodiments, the erasing method may be adopted by the memory device 1 to verify and reset the dummy memory cells Cd(1) to Cd(P). Any reasonable step change or adjustment is within the scope of the disclosure. Steps S502 to S508 are explained as follows:

Step S502: The controller 10 erases the main memory cells;

Step S504: The controller 10 verifies the special memory cells;

Step S506: Has at least one special memory cell failed the verification? If so, go to Step S507; and if not, exit the method 500;

Step S507: Is reset preference enabled? If so, go to Step S508; and if not, exit the method 500;

Step S508: The controller 10 resets the at least one special memory cell; exit the method 500.

Upon initialization of the erasing method 500, the controller 10 erases the main memory cells Cm(1,N) to Cm(P,N) (S502), and next verifies the special memory cells using an upper verification level and a lower verification level (S504). The upper verification level and the lower verification level may be selected according to the lower bound and the upper bound of a predetermined threshold voltage distribution range of the special memory cells, respectively. When the threshold voltage of at least one special memory cell is outside the predetermined threshold voltage distribution range, the at least one special memory cell may not function properly and may lead to program disturbance, and the at least one special memory cell has failed the verification. The controller 10 determines whether at least one special memory cell has failed the verification (S506), if not, the controller 10 exits the method 500, and if so, the controller 10 determines whether the reset preference is set to be enabled (S507). If at least one special memory cell has failed the verification and the reset preference is not set to be enabled, the method 500 is exited directly without resetting the at least one special memory cell. If the at least one special memory cell has failed the verification and the reset preference is set to be enabled, the controller 10 resets the at least one special memory cell by bringing the threshold voltage of the at least one special memory cell back within the predetermined threshold voltage distribution range (S508), and then exits the method 500 (S508).

Figure 6:
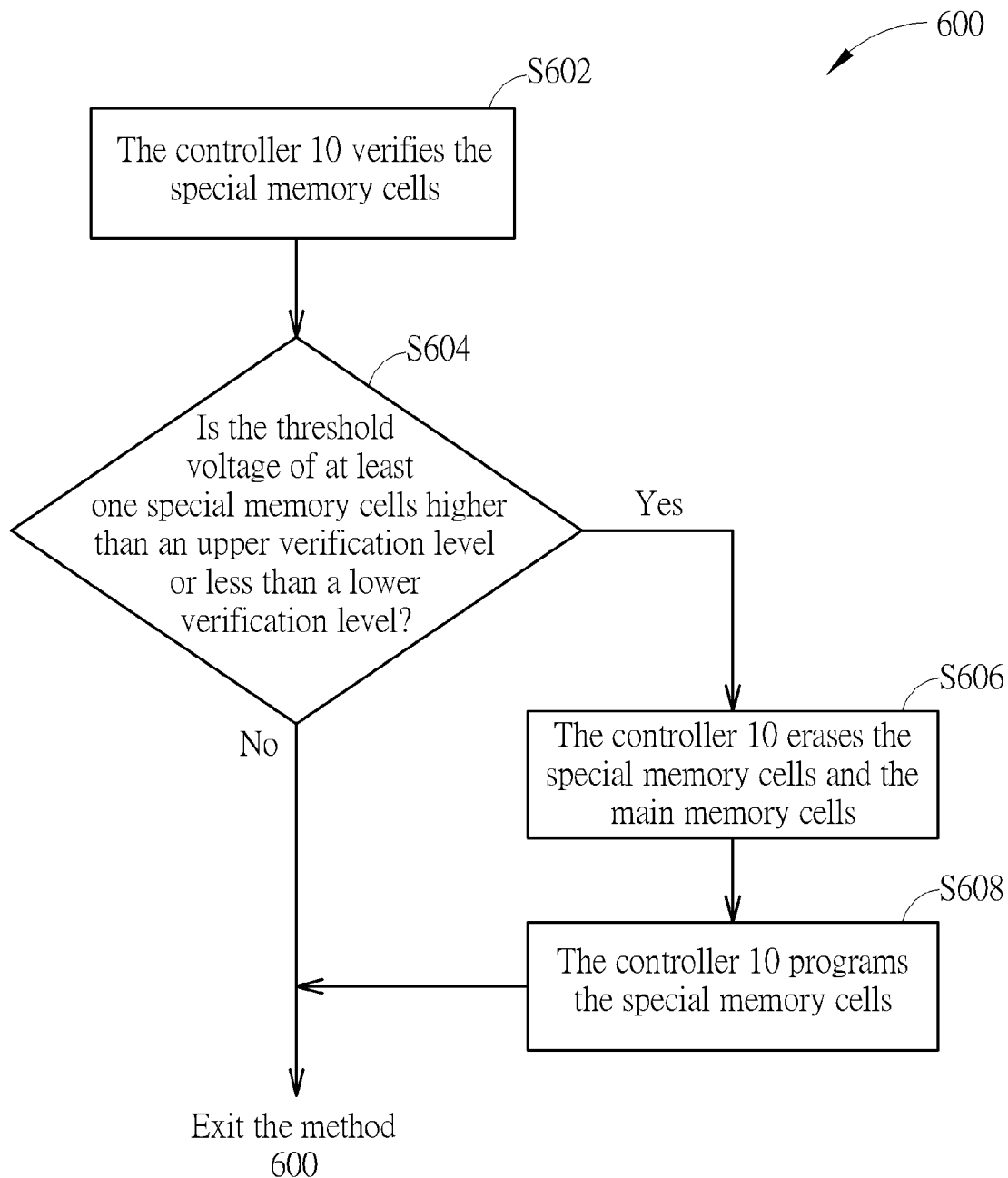
FIG. 6 is a flowchart of a resetting method incorporated in the erasing method in FIG. 5.

FIG. 6 is a flowchart of a resetting method 600 to be incorporated in the method 500. The method 600 comprises Steps S602 to S608 for resetting the special memory cells.

Any reasonable step change or adjustment is within the scope of the disclosure. Steps S602 to S608 are explained as follows:

Step S602: The controller 10 verifies the special memory cells;

Step S604: Is the threshold voltage of at least one special memory cells higher than an upper verification level or less than a lower verification level? If so, go to Step S606; and if not, exit the method 600;

Step S606: The controller 10 erases the special memory cells and the main memory cells;

Step S608: The controller 10 programs the special memory cells; exit the method 600.

In Step S602, the controller 10 applies the lower verification level or the upper verification level to the control terminals of the special memory cells to read the states thereof, and in Step S604, the controller 10 determines whether the threshold voltage of at least one special memory cell is higher than the upper verification level or less than the lower verification level according to the reading result. If a state of at least one special memory cell is read correctly using the lower verification level, the threshold voltage of the at least one special memory cell is less than the lower verification level and being too low, and if a state of at least one special memory cell is read incorrectly using the upper verification level, the threshold voltage of the at least one special memory cell is higher than the upper verification level and being too high. If the threshold voltage of at least one special memory cell is higher than the upper verification level or less than the lower verification level, the controller 10 erases the special memory cells and the main memory cells Cm(1,1) to Cm(P,N) (S606), then programs the special memory cells to the corresponding predetermined states (S608), and exits the method 600. The erasing of the special memory cells and the main memory cells Cm(1,1) to Cm(P, N) may be performed by grounding the control terminals of the special memory cells and the main memory cells Cm(1, 1) to Cm(P,N) while applying an appropriate erasing voltage to the bit lines of the special memory cells and the main memory cells Cm(1,1) to Cm(P,N), thereby discharging all charges from the floating gate or charge-trapping layer of the special memory cells and the main memory cells Cm(1,1) to Cm(P,N).

The memory device 1 and the methods 300 to 600 may be adopted to verify and reset special memory cells in the memory device 1 in an erasing operation, thereby reducing program disturbance and enhancing device performance.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A memory device, comprising:
a string of cells comprising a top selection cell, a dummy memory cell, and memory cells; and
a controller coupled to the string of cells and configured to, during an erasing operation:
verify whether at least one of the top selection cell or the dummy memory cell is failed based on comparisons of a threshold voltage of the at least one of the top selection cell or the dummy memory cell with a first verification level and a second verification level, respectively; and
in response to the at least one of the top selection cell or the dummy memory cell being failed, reset the at least one of the top selection cell or the dummy memory cell, comprising adjusting the threshold voltage of the at least one of the top selection cell or the dummy memory cell to be within a level between the first and second verification levels.

2. The memory device of claim 1, wherein the controller is further configured to erase the memory cells.

3. The memory device of claim 2, wherein the controller is configured to verify whether the at least one of the top selection cell or the dummy memory cell is failed prior to erasing the memory cells.

4. The memory device of claim 3, wherein to verify, the controller is configured to:
determine whether the threshold voltage of the at least one of the top selection cell or the dummy memory cell is lower than the first verification level; and
in response to the threshold voltage of the at least one of the top selection cell or the dummy memory cell being lower than the first verification level, apply a program voltage to the at least one of the top selection cell or the dummy memory cell.

5. The memory device of claim 3, wherein to verify, the controller is configured to:
determine whether the threshold voltage of the at least one of the top selection cell or the dummy memory cell is higher than the second verification level; and
in response to the threshold voltage of the at least one of the top selection cell or the dummy memory cell being higher than the second verification level, perform a soft erasing operation on the at least one of the top selection cell or the dummy memory cell.

6. The memory device of claim 2, wherein the controller is configured to verify whether the at least one of the top selection cell or the dummy memory cell is failed after erasing the memory cells.

7. The memory device of claim 6, wherein the controller is further configured to:
erase the at least one of the top selection cell or the dummy memory cell; and
apply a program voltage to the at least one of the top selection cell or the dummy memory cell.

8. The memory device of claim 1, wherein the memory device is a three-dimensional (3D) NAND Flash memory device.

9. The memory device of claim 1, wherein the top selection cell and the dummy memory cell are programmed into a predetermined state prior to a programming operation.

10. The memory device of claim 1, wherein the controller is further configured to, in response to the at least one of the top selection cell or the dummy memory cell being failed and a reset preference setting being enabled, adjust the threshold voltage of the at least one of the top selection cell or the dummy memory cell to be within the level between the first and second verification levels and erase the memory cells.

11. The memory device of claim 4, wherein the controller is configured to, in response to the threshold voltage of the at least one of the top selection cell or the dummy memory cell being lower than the first verification level, apply one or more program pulses to the at least one of the top selection cell or the dummy memory cell until the controller is unable to read a state of the at least one of the top selection cell or the dummy memory cell.

12. The memory device of claim 5, wherein the controller is configured to, in response to the threshold voltage of the at least one of the top selection cell or the dummy memory cell being higher than the second verification level, ground a control terminal of the at least one of the top selection cell or the dummy memory cell while applying a soft erasing voltage to a bit line of the at least one of the top selection cell or the dummy memory cell.

13. A method for operating a memory device comprising a string of cells comprising a top selection cell, a dummy memory cell, and memory cells, the method comprising, during an erasing operation:
verifying whether at least one of the top selection cell or the dummy memory cell is failed based on comparisons of a threshold voltage of the at least one of the top selection cell or the dummy memory cell with a first verification level and a second verification level, respectively; and
in response to the at least one of the top selection cell or the dummy memory cell being failed, resetting the at least one of the top selection cell or the dummy memory cell, comprising adjusting the threshold voltage of the at least one of the top selection cell or the dummy memory cell to be within a level between the first and second verification levels.

14. The method of claim 13, further comprising erasing the memory cells.

15. The method of claim 14, wherein verifying whether the at least one of the top selection cell or the dummy memory cell is failed occurs prior to erasing the memory cells.

16. The method of claim 15, wherein verifying whether the at least one of the top selection cell or the dummy memory cell is failed comprises:
determining whether the threshold voltage of the at least one of the top selection cell or the dummy memory cell is lower than the first verification level; and
in response to the threshold voltage of the at least one of the top selection cell or the dummy memory cell being lower than the first verification level, applying a program voltage to the at least one of the top selection cell or the dummy memory cell.

17. The method of claim 15, wherein verifying whether the at least one of the top selection cell or the dummy memory cell is failed comprises:
determining whether the threshold voltage of the at least one of the top selection cell or the dummy memory cell is higher than the second verification level; and
in response to the threshold voltage of the at least one of the top selection cell or the dummy memory cell being higher than the second verification level, performing a soft erasing operation on the at least one of the top selection cell or the dummy memory cell.

18. The method of claim 14, wherein verifying whether the at least one of the top selection cell or the dummy memory cell is failed occurs after erasing the memory cells.

19. The method of claim 18, further comprising:
erasing the at least one of the top selection cell or the dummy memory cell; and
applying a program voltage to the at least one of the top selection cell or the dummy memory cell.

20. The method of claim 13, wherein the memory device is a three-dimensional (3D) NAND Flash memory device.

* * * * *